(12) United States Patent
Shinozaki

(10) Patent No.: US 6,373,159 B1
(45) Date of Patent: Apr. 16, 2002

(54) SUBSTRATE ROTATING APPARATUS

(75) Inventor: Hiroyuki Shinozaki, Kanagawa-Ken (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/617,779

(22) Filed: Jul. 17, 2000

(30) Foreign Application Priority Data

Jul. 19, 1999 (JP) .......................................... 11-205374
Dec. 27, 1999 (JP) .......................................... 11-369558

(51) Int. Cl.$^7$ ........................ H01L 21/02; C23C 14/00; H02K 7/09
(52) U.S. Cl. ...................... 310/90.5; 118/730; 118/715
(58) Field of Search ...................... 310/90.5; 118/715, 118/730

(56) References Cited

U.S. PATENT DOCUMENTS

| 4,353,602 A |   | 10/1982 | Habermann ................. 310/90.5 |
| 5,072,146 A | * | 12/1991 | New .......................... 310/90.5 |
| 5,471,105 A | * | 11/1995 | Clifton et al. ............... 310/90.5 |
| 5,818,137 A |   | 10/1998 | Nichols et al. ............. 310/90.5 |
| 5,965,047 A |   | 10/1999 | Blersch et al. ............. 219/390 |
| 6,022,413 A |   | 2/2000  | Shinozaki et al. .......... 118/715 |

FOREIGN PATENT DOCUMENTS

| JP | 9-31656 | 2/1997 | ........... C23C/16/40 |
| JP | 9-531181 | 2/1997 | ........... C23C/16/44 |

* cited by examiner

*Primary Examiner*—Burton S. Mullins
(74) *Attorney, Agent, or Firm*—Wenderoth, Lind & Ponack, L.L.P.

(57) ABSTRACT

A rotor is placed in a space communicating with a processing chamber. Stator-side constituent members of magnetic bearings and a stator-side constituent member of a motor are placed in a space defined outside the space communicating with the processing chamber by a partition provided between the rotor and the stator-side constituent members. Further, a material electromagnetically equivalent to yokes of electromagnets as stator-side constituent members of the magnetic bearings is fitted in portions of the partition where the yokes are located. The partition constitutes a stator housing as a whole. The magnetic bearings include an axial magnetic bearing and a radial magnetic bearing. The axial magnetic bearing is divided into three or more magnetic bearings, which are positioned so that imaginary lines connecting points where the divided axial magnetic bearings are disposed form an approximately regular triangle or polygon.

11 Claims, 13 Drawing Sheets

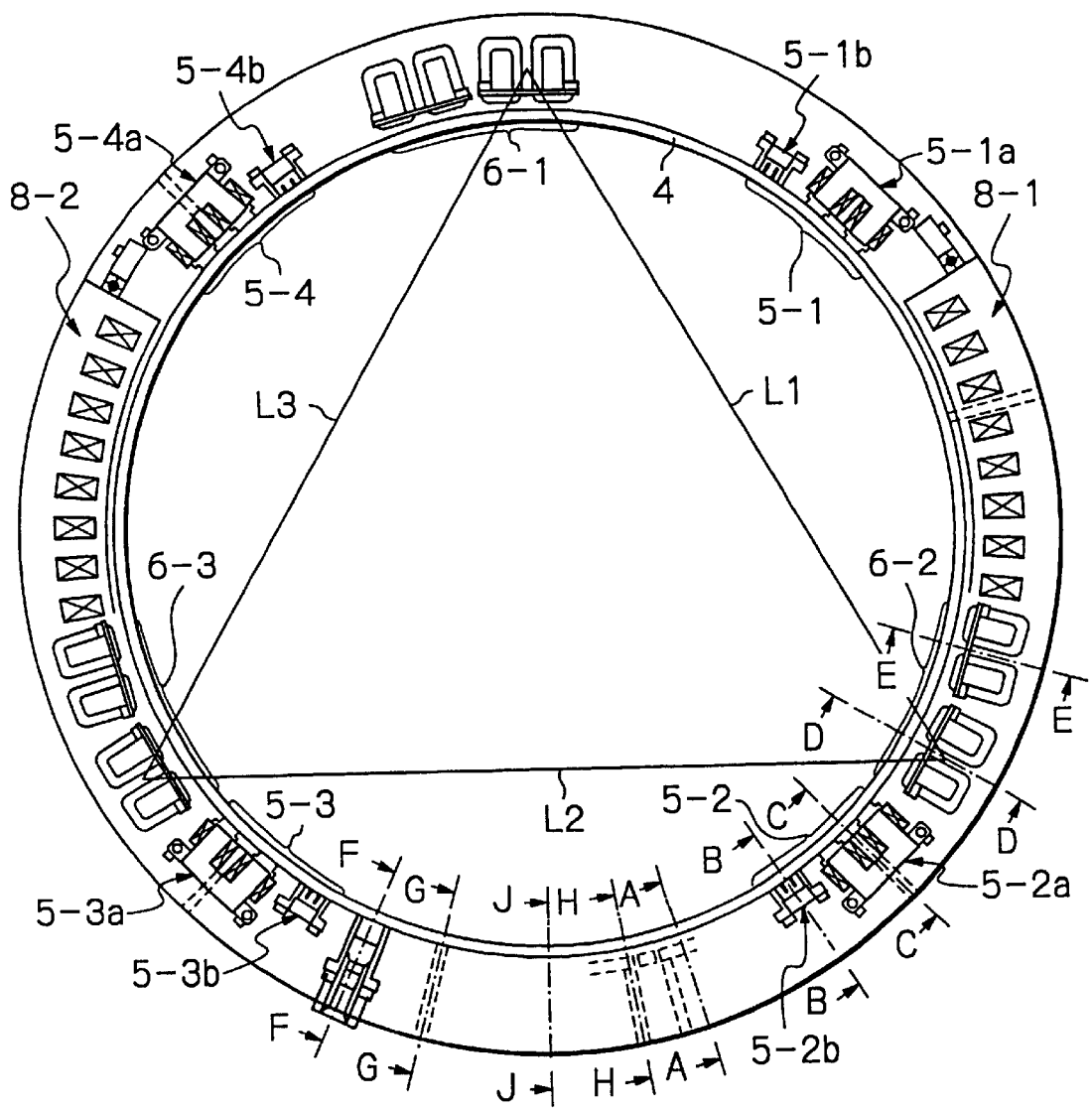

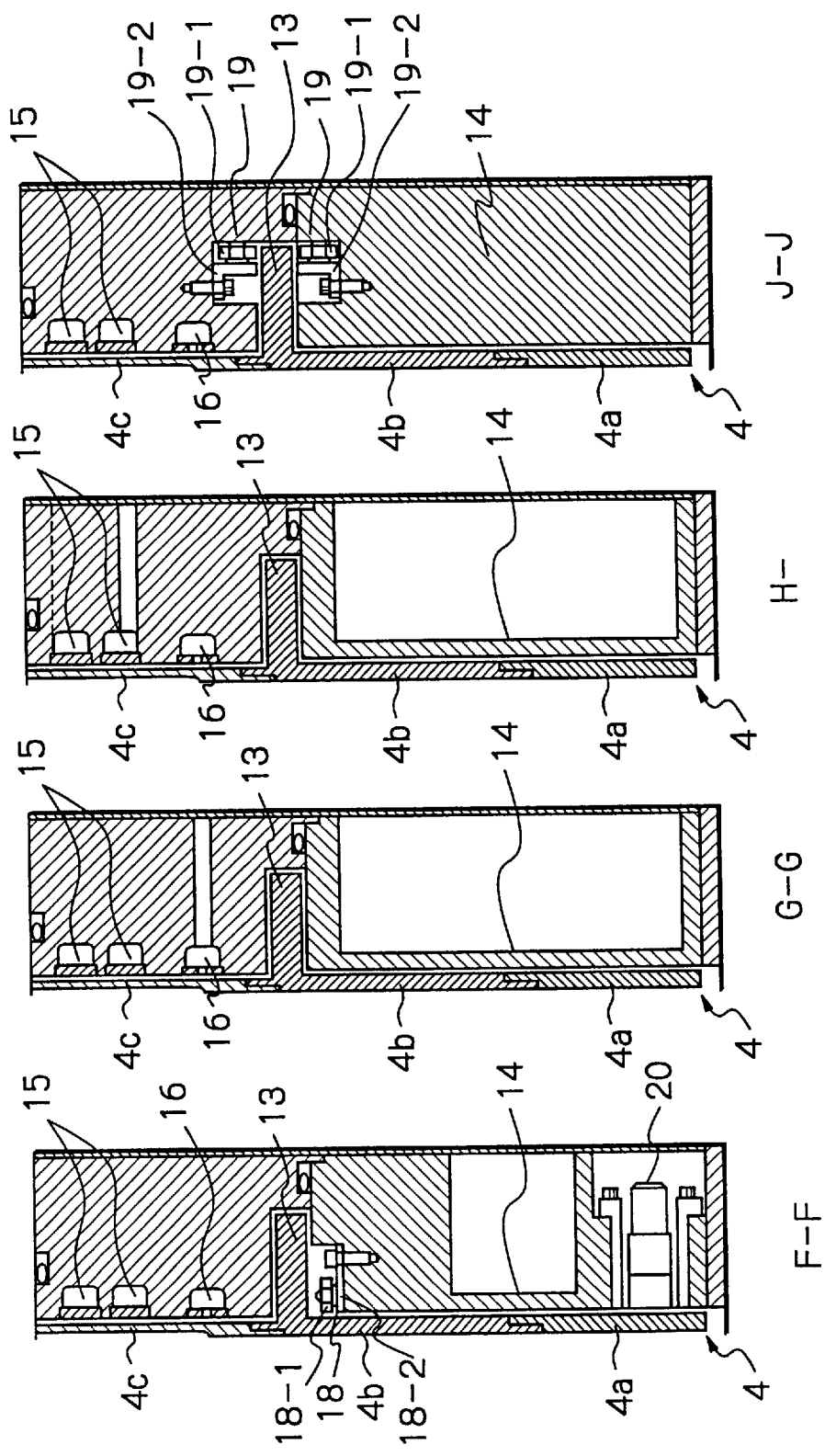

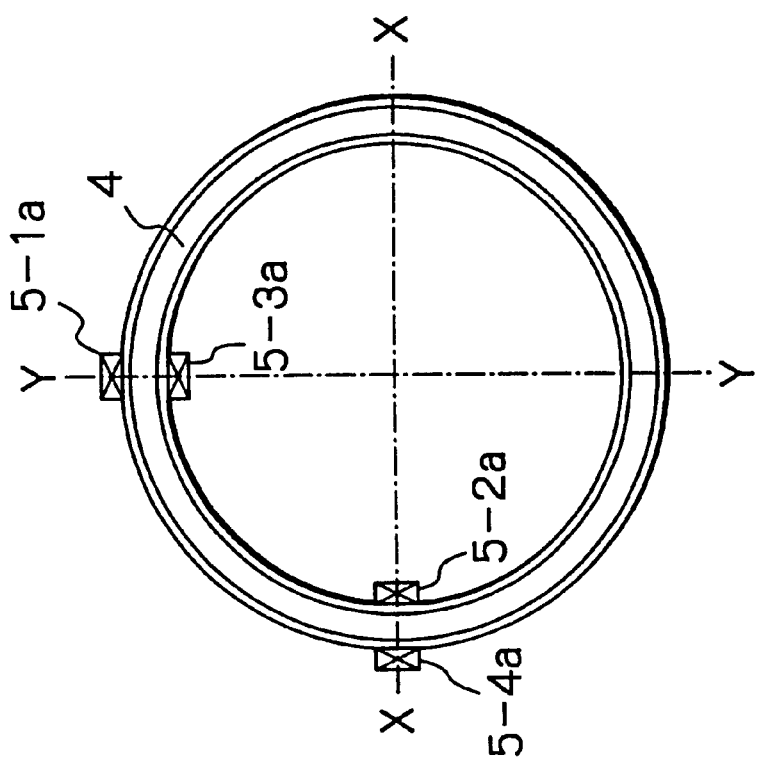
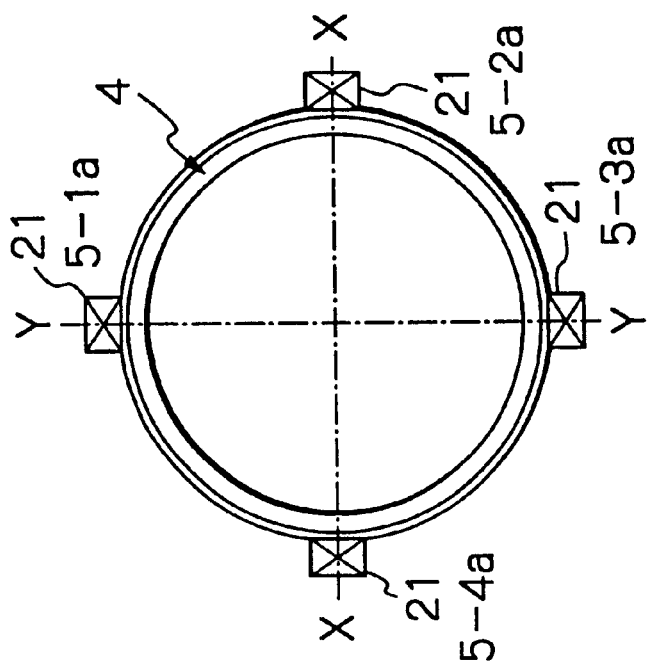

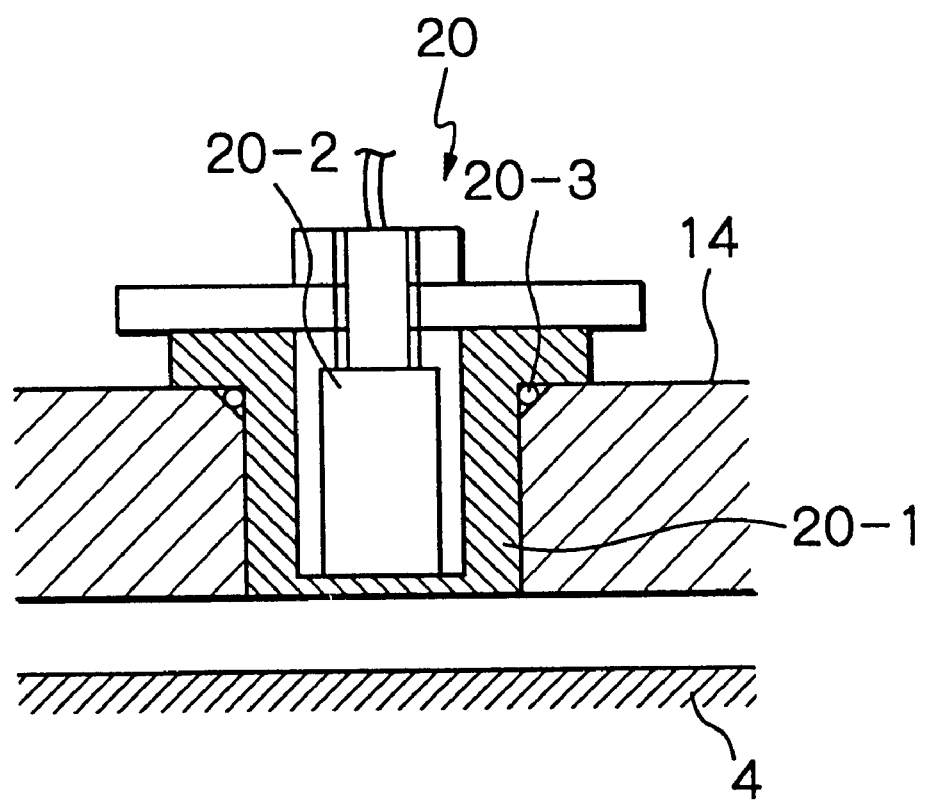

SUBSTRATE ROTATING APPARATUS

BACKGROUND OF THE INVENTION

The present invention relates to a substrate rotating apparatus for rotating a substrate to be processed, e.g. a semiconductor substrate, in a processing chamber. More particularly, the present invention relates to a substrate rotating apparatus for rotating a substrate in a processing chamber of a system in which a substrate is processed in a special atmosphere, e.g. in a CVD system for forming a thin film on a substrate, an etcher system for thinly removing the surface of a substrate, or a rapid thermal annealing (RTA) system.

In a system wherein a substrate is processed in a special atmosphere, e.g. in a cvb system or an etcher system, as shown in FIG. 1, a substrate 101 to be processed is mounted on a substrate holder or susceptor 102 and rotated in a processing chamber 103 by rotating the substrate holder or susceptor 102. This kind of system, however, involves some problems, e.g. generation of dust or release of gas from a rotating mechanism for rotating the substrate holder or susceptor 102, and a problem in terms of the lifetime of bearings. In view of these problems, there has been proposed a system in which magnetic bearings (radial bearings 105 and 106 and an axial bearing 107) are used as bearings for rotatably supporting a rotor 104.

In the above-described system wherein a substrate is processed in a special atmosphere, e.g. in a CVD system or an etcher system for thinly removing the surface of a substrate, a corrosive gas is often used in the processing chamber 103. Therefore, the gas contact portion of a stator-side constituent member of each magnetic bearing is covered with a cylindrical pressure resistive partition (can). However, as the diameter of the substrate 101 increases, the diameter of the rotor 104 of the rotating mechanism also increases. Consequently, it is necessary to increase the strength (rigidity) of the pressure resistive partition.

For example, when an external pressure of 1 kgf·cm$^2$ is applied to a stainless steel cylindrical partition having an inner diameter of 400 to 500 mm, the wall thickness to withstand a buckling stress of 1 kgf·cm$^2$ is about 3 to 5 mm. When the wall thickness is about 0.3 mm, i.e. about one tenth of the above-mentioned value, buckling stress is reached when the pressure difference is 1 Torr. Accordingly, as the diameter of the rotor 104 increases, the wall thickness of the partition also needs to be increased. Increasing the wall thickness of the partition causes an increase in the gaps between stator-side electromagnets 105a, 106a, 107a and 107b and rotor-side targets of the radial magnetic bearings 105 and 106 and the axial magnetic bearing 107, resulting in a reduction in control magnetic force. To obtain satisfactorily large control magnetic force, therefore, it is necessary to increase the number of windings of each electromagnet or to intensify the exciting current. This causes the magnetic bearings to become undesirably large in size. In FIG. 1: reference numeral 108 denotes a motor stator for applying rotational force to the rotor 104; 109 denotes a quartz window; 110 denotes a lamp heater unit for heating the inside of the processing chamber 103; and 111 and 112 denote load-unload gates for loading and unloading the substrate 101 into and out of the chamber 103.

Moreover, as the diameter of the rotor 104 increases, the diameters of the electromagnets 107a and 107b of the axial magnetic bearing 107 also increase. Accordingly, unstable torque (unbalanced torque) produced by the electromagnets 107a and 107b becomes so large that it cannot be ignored.

If two radial magnetic bearings 105 and 106 are provided axially spaced (for 4 axes, two for each bearing) for the purpose of compensating for the unbalanced torque, the axial length increases, and hence the space efficiency decreases. Regarding the rotor characteristics, the design is dangerous because the inertia moment ratio of the rotor is close to 1.

SUMMARY OF THE INVENTION

In view of the above-described circumstances, an object of the present invention is to provide a substrate rotating apparatus which is capable of avoiding an increase in size of the diameter of the electromagnet of the axial magnetic bearing and capable of reducing unstable force such as unstable torque produced by the electromagnets, even if the diameter of the rotor is increased.

Another object of the present invention is to provide a substrate rotating apparatus which is capable of avoiding an increase in magnetic reluctance between the rotor-side target and the stator-side magnet yoke even if the partition provided therebetween is formed from thick-walled material and whereby a large control magnetic force can be obtained without enlarging the size of the magnetic bearings or without increasing the number of windings thereof.

To attain the above-described object, the present invention provides a substrate rotating apparatus including a rotor for rotating a substrate mounted thereon. The rotor has a horizontal disk provided thereon and is supported by magnetic bearings. The substrate rotating apparatus further includes a motor for applying rotational force to the rotor to rotate the substrate in a processing chamber. The magnetic bearings include an axial magnetic bearing and a radial magnetic bearing. The axial magnetic bearing is divided into three or more magnetic bearings, which are positioned so that imaginary lines connecting points where the divided axial magnetic bearings are disposed form an approximately regular triangle or polygon. Electromagnets constituting the axial magnetic bearings are disposed substantially above and below the horizontal disk of the rotor.

Because the axial magnetic bearing is divided into three or more magnetic bearings and these magnetic bearings are positioned so that imaginary lines connecting points where the divided axial magnetic bearings are disposed form an approximately regular triangle or polygon, even if the diameter of the rotor increases, the diameter of the electromagnet of each of the axial magnetic bearings will not increase. In addition, because position control in the axial direction is effected at the position of each axial magnetic bearing, motion about the radial axes is also stabilized. Accordingly, any unstable force such as unstable torque (unbalanced torque) produced by the electromagnets of the conventional axial magnetic bearing is minimized.

Preferably, the rotor is placed in a space communicating with the processing chamber, and stator-side constituent members of the magnetic bearings and a stator-side constituent member of the motor are placed in a space defined outside the space communicating with the processing chamber by a partition provided between the rotor and the stator-side constituent members. Further, a material electromagnetically equivalent to yokes of electromagnets as stator-side constituent members of the magnetic bearings is fitted in or inserted in portions of the partition where the yokes are located, and the partition constitutes a stator housing as a whole.

Instead, the ends of yokes of electromagnets as stator-side constituent members of the magnetic bearings may pierce through the partition so as to face the rotor directly.

If a material electromagnetically equivalent to the yokes of electromagnets as stator-side constituent members of the magnetic bearings is fitted in portions of the partition where the yokes are located, or the ends of yokes of electromagnets as stator-side constituent members of the magnetic bearings pierce through the partition so as to face the rotor directly, there is no increase in magnetic reluctance between the rotor-side target and the stator-side magnet yoke even if the partition, which constitutes the stator housing as a whole, is formed by using a thick-walled material. Accordingly, large control magnetic force can be obtained.

In the above-described substrate rotating apparatus, translational motion in two radial axes (X- and Y-directions) is preferably passively supported by a radial restoring force generated when the relative position between the yoke of an electromagnet as a stator-side constituent member of the axial magnetic bearing and the horizontal disk as a rotor-side constituent member of the axial magnetic bearing is displaced in a translational direction (horizontal direction).

In the above-described substrate rotating apparatus, radial magnetic bearings may be provided at one or a plural of axial position(s).

Preferably, the stator housing has a cooling zone in the vicinity of the processing chamber and further has a gas purge zone located across the cooling zone from the processing chamber.

The above and other objects, features and advantages of the present invention will become more apparent from the following description of the preferred embodiments thereof, taken in conjunction with the accompanying drawings.

BRIEF DESCRIPTION OF THE DRAWINGS

FIG. 3 is a diagram showing a planar arrangement of component parts of the substrate rotating apparatus according to the embodiment of the present invention.

FIGS. 9(a) and 9(b) are diagrams showing an arrangement of electromagnets of radial magnetic bearings with respect to a rotor.

FIG. 10 is a sectional view showing a rotational position sensor of the substrate rotating apparatus according to the present invention and a sensor mounting structure.

FIGS. 11(a) and 11(b) are diagrams showing a structural example of a magnetic bearing of the substrate rotating apparatus according to the present invention, in which FIG. 11(a) is a sectional view of the magnetic bearing, and FIG. 11(b) is a view as seen in a direction of the arrow A—A in FIG. 11(a).

DETAILED DESCRIPTION OF THE INVENTION

Embodiments of the present invention will be described below in detail with reference to the accompanying drawings.

Figure 1:
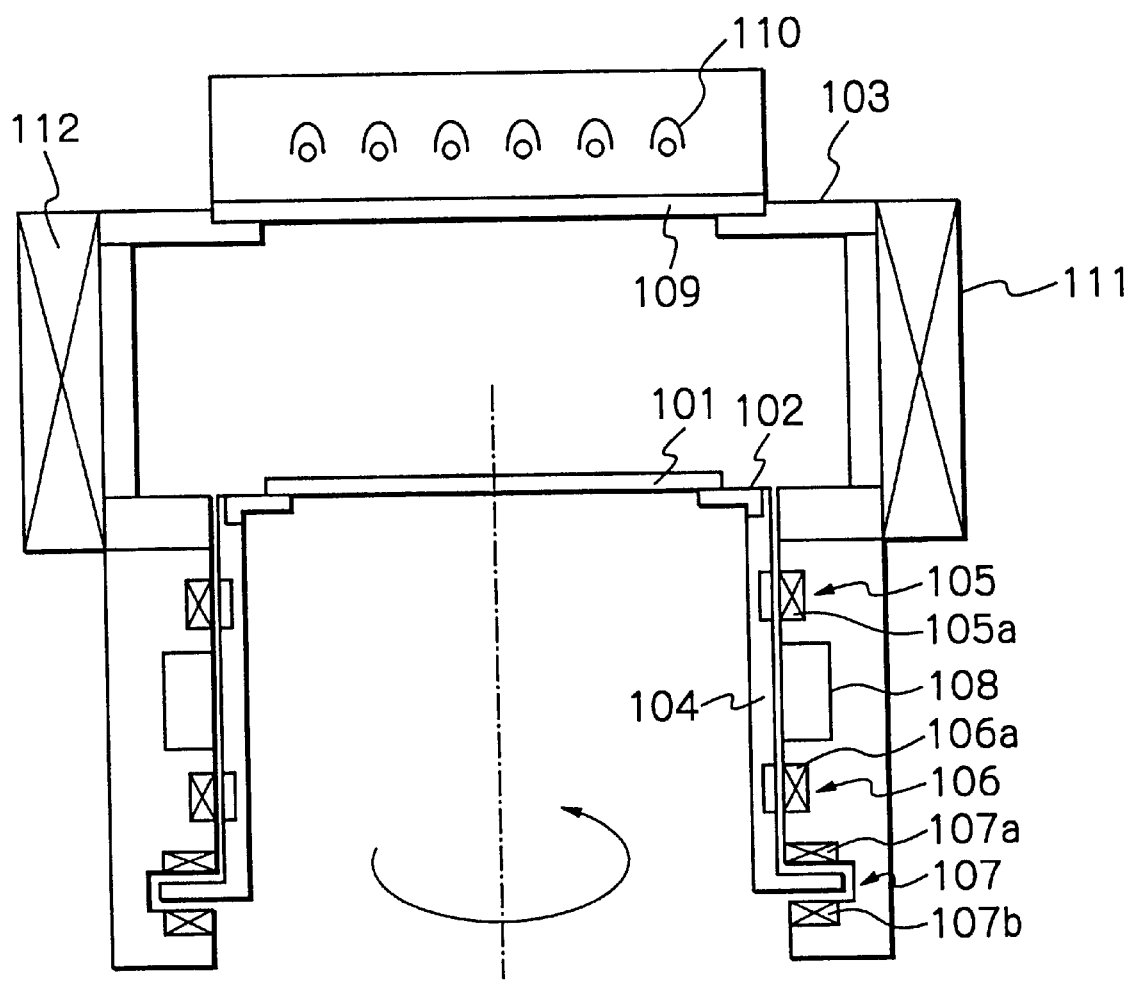
FIG. 1 is a schematic view showing a structural example of a conventional substrate rotating apparatus.
Figure 2:
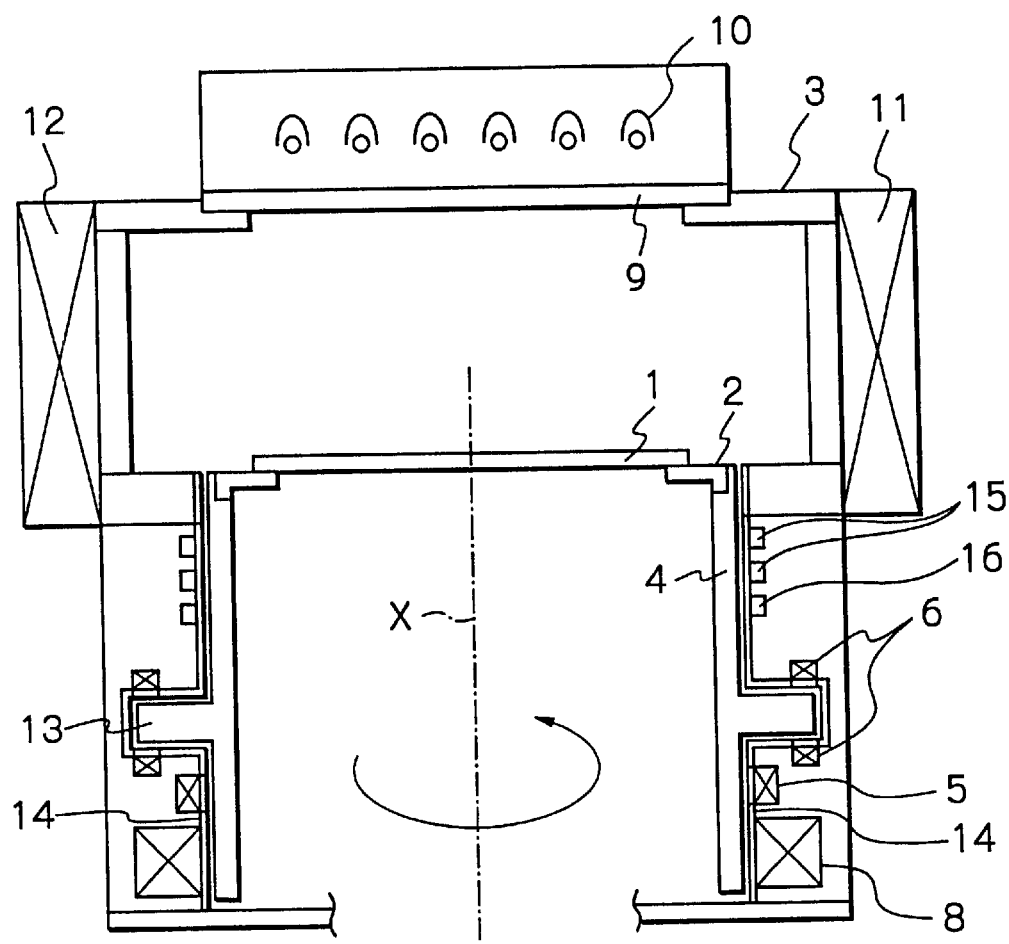
FIG. 2 is a schematic view of a structural example of a substrate rotating apparatus according to an embodiment of the present invention.
Figures 4A, 4B, 4C, 4D, 4E:
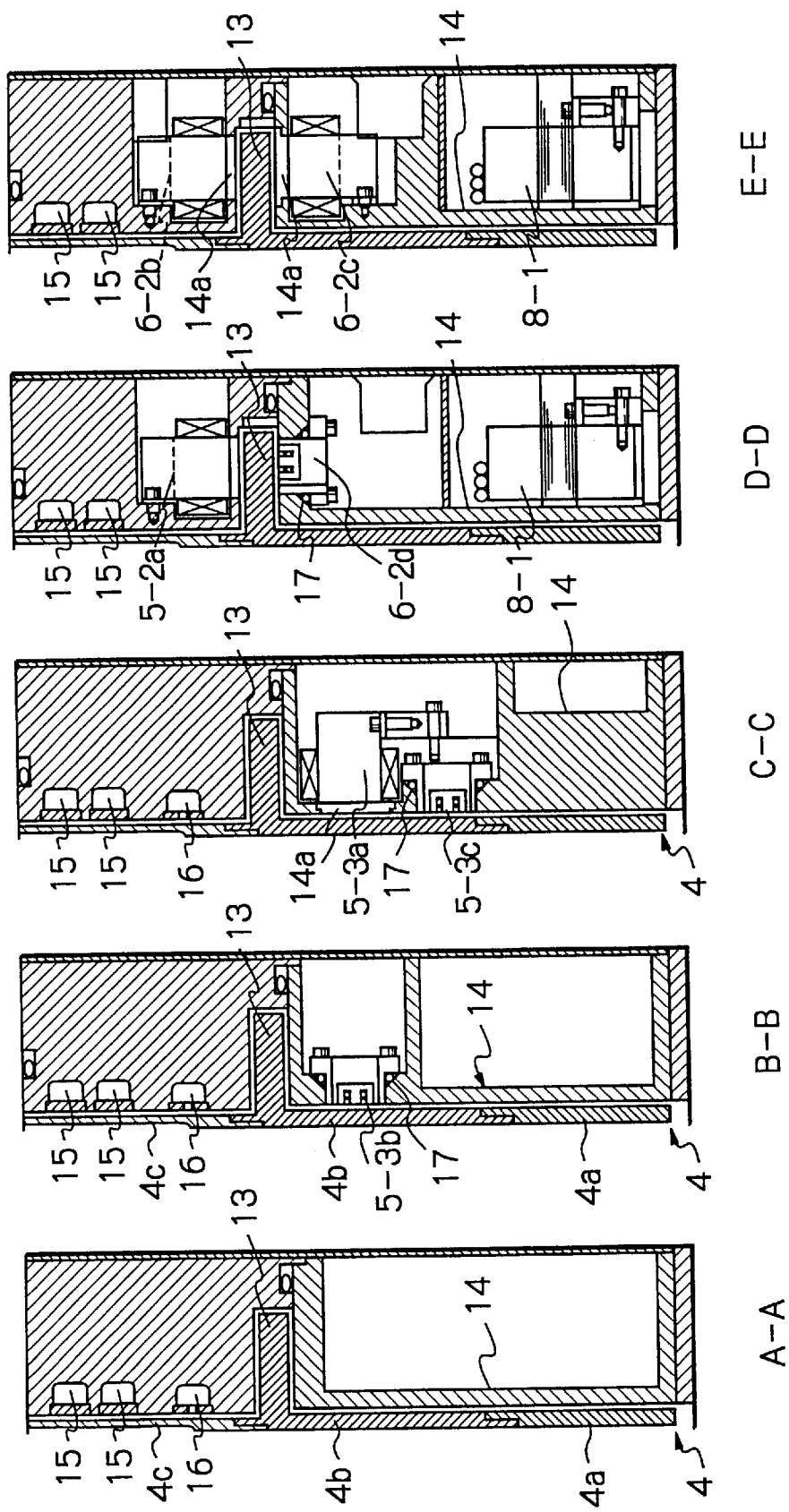

FIG. 2 is a diagram schematically showing the arrangement of the substrate rotating apparatus according to the present invention. A substrate 1 to be processed is mounted on a ring-like substrate holder or susceptor 2 and rotated about its axis X in a processing chamber 3 by rotating the substrate holder or susceptor 2. The substrate holder or susceptor 2 is secured to the upper end of a cylindrical rotor 4. The rotor 4 is supported in a magnetic levitation manner by a radial magnetic bearing 5 and an axial magnetic bearing 6 as detailed later.

In FIG. 2: reference numeral 8 denotes a motor stator for applying rotational force to the rotor 4; 9 denotes a quartz window; 10 denotes a lamp heater unit; 11 and 12 denote load-unload gates for loading and unloading the substrate 1; 13 denotes a horizontal disk as a rotor-side target of the axial magnetic bearing 6, which is horizontally provided on the outer periphery of the rotor 4; 15 denotes cooling zones; and 16 denotes a gas purge zone. The details of each part will be described below.

Figure 6:
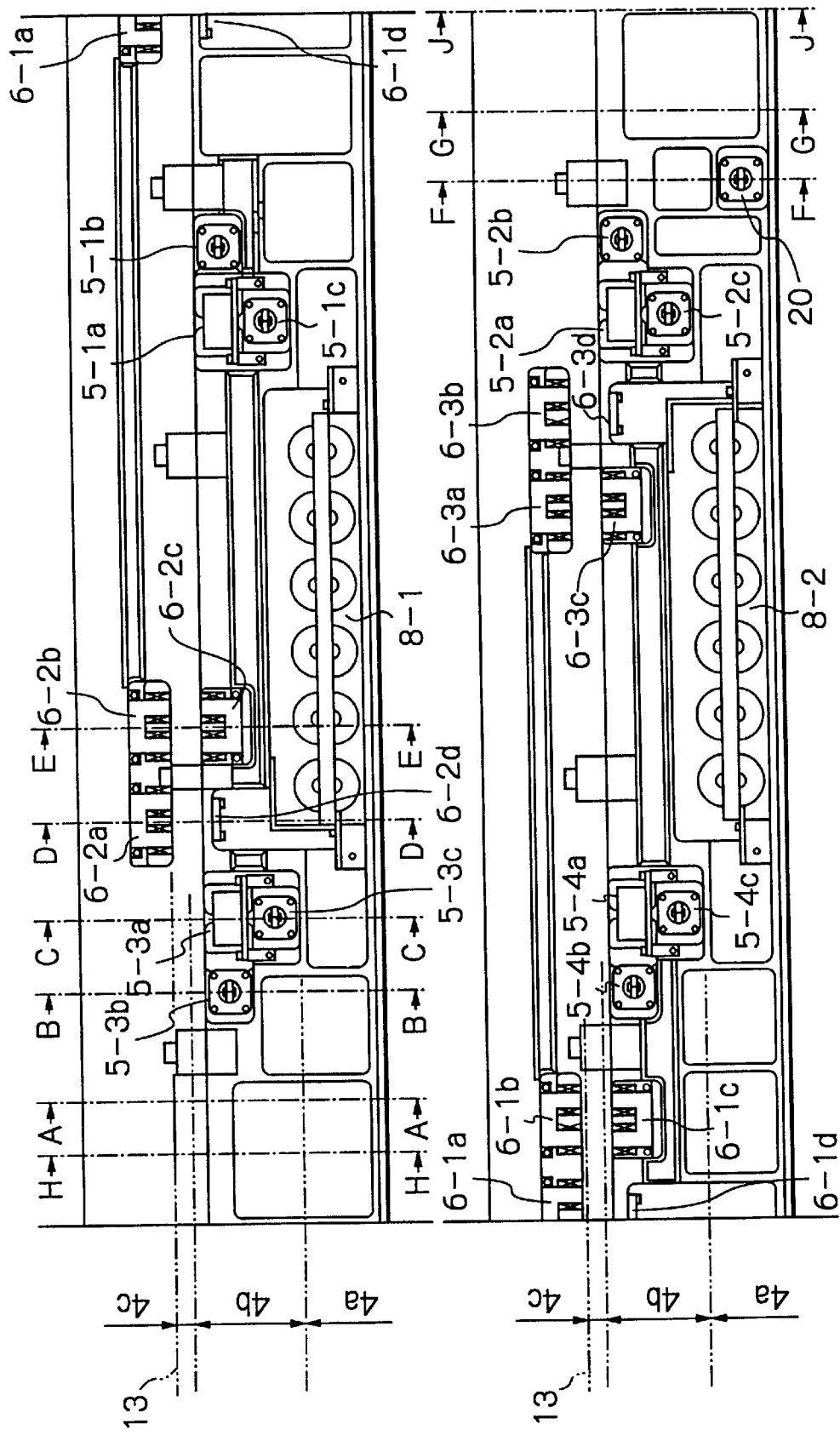
FIG. 6 is a development of an outer peripheral surface of the substrate rotating apparatus according to the embodiment of the present invention.

FIGS. 3 to 6 are diagrams showing the arrangement of the substrate rotating apparatus according to the present invention. FIG. 3 is a diagram showing the planar arrangement of component parts. FIGS. 4(a) to 4(e) show sections taken along the lines A—A to E—E in FIG. 3, respectively. FIGS. 5(f) to 5(j) show sections taken along the lines F—F to J—J in FIG. 3, respectively. FIG. 6 is a development of the outer peripheral surface of the apparatus. As illustrated in the Figures, electromagnets 5-1a, 5-2a, 5-3a and 5-4a, which are stator-side constituent members of radial magnetic bearings 5-1 to 5-4, are disposed to face the outer peripheral surface of a cylindrical rotor 4. The electromagnets 54a and 5-3a pair up with each other to support the rotor 4 in X-axis direction. The electromagnets 5-2a and 5-4a pair up with each other to support the rotor 4 in Y-axis direction.

Displacement sensors 5-1b, 5-1c, 5-2b, 5-2c, 5-3b, 5-3c, 5-4b and 5-4c, which are stator-side constituent members of the radial magnetic bearings 5-1 to 5-4, are disposed to face the outer periphery of the rotor 4 in the vicinity of the electromagnets 5-1a, 5-2a, 5-3a and 5-4a, respectively, to detect displacement of the rotor 4 in X and Y axes directions (FIGS. 3 and 6).

In each pair of the displacement sensors, one is used for monitoring the displacement of the rotor and the other one is used for controlling of the same.

The axial magnetic bearing 6 is divided into three axial magnetic bearings 6-1, 6-2 and 6-3, which are positioned so that lines L1, L2 and L3 connecting points where the axial magnetic bearings 6-1, 6-2 and 6-3 are disposed form an approximately regular triangle. The axial magnetic bearing 6-1 has two upper electromagnets 6-1a and 6-1b and one lower electromagnet 6-1c as stator-side constituent members, which are disposed to face upper and lower surfaces of the horizontal disk 13. The axial magnetic bearing 6-2 has two upper electromagnets 6-2a and 6-2b and one lower electromagnet 6-2c, which are disposed to face upper and lower surfaces of the horizontal disk 13. The axial magnetic bearing 6-3 also has two upper electromagnets 6-3a and 6-3b and one lower electromagnet 6-3c, which are disposed to face upper and lower surfaces of the horizontal disk 13.

In each axial magnetic bearing, the two upper electromagnets are provided to prepare for or cope with the change in the specification of the mass of the rotor or load thereto.

Displacement sensors 6-1d, 6-2d and 6-3d, which are stator-side constituent members of the axial magnetic bearing 6, are disposed to face lower surface of the horizontal disk 13 in the vicinity of the lower electromagnets 6-1c, 6-2c and 6-3c, respectively. Below the horizontal disk 13, stators 8-1 and 8-2 of the motor 8 are disposed to face the rotor 4.

The rotor 4 is placed in a space communicating with the processing chamber 3. The stator-side constituent members of the radial magnetic bearing 5, the axial magnetic bearing 6 and the motor 8 are placed in a space defined outside the space communicating with the processing chamber 3 by a partition (can) 14 provided between the rotor 4 and the stator-side constituent members.

It is desired that the thickness of the partition 14 be reduced to be as thin as possible from the viewpoint of reducing the size of each of the electromagnets 5-1a to 5-4a of the radial magnetic bearings 5-1 to 5-4 and the electromagnets 6-1a, 6-1b and 6-1c to 6-3a, 6-3b and 6-3c of the axial magnetic bearings 6-1 to 6-3. However, because the inside of the processing chamber 3 is placed under a vacuum and a special gas is used to process the substrate 1, it is necessary to impart an adequate strength to the partition 14 to improve reliability. For this reason, the partition 14 in the present invention has a pressure vessel structure. Portions 14a of the partition 14 where the yokes (magnetic poles) of the electromagnets 5-1a to 5-4a and the electromagnets 6-1a, 6-1b and 6-1c to 6-3a, 6-3b and 6-3c are located are made of a magnetic material of the same electromagnetic property as that of the yokes. The magnetic material is fitted in or inserted in the portions 14a of the partition 14. Then, the partition 14 is subjected to finishing to form a pressure vessel structure. Thus, the gap between the yokes and the rotor 4 is reduced, and it is possible to apply increased control magnetic force to the rotor 4. Accordingly, it is unnecessary to increase the size or the magnetomotive force (ampere-turns) of the electromagnets despite the provision of the partition 14 having a pressure vessel structure.

The partition 14 has the cooling zones (water cooling jackets) 15 provided in the vicinity of a portion thereof that is coupled to the processing chamber 3 to remove both heat from the processing chamber 3 and heat from the upper electromagnets 6-1a and 6-1b to 6-3a and 6-3b of the axial magnetic bearings 6-1 to 6-3.

The partition 14 further has the gas purge zone 16 located across the cooling zones 15 from the processing chamber 3 to supply a gas in the gap between the rotor 4 and a portion of the partition 14 where the cooling zones 1 are located. A gas of good thermal conductivity is used in the gas purge zone 16 to transfer heat from the rotor 4 to the cooling zones 15 efficiently.

The displacement sensors 5-1b and 5-1c to 5-4b 4b and 5-4c of the radial magnetic bearings 5-1 to 5-4 and the displacement sensors 6-1d to 6-3d of the axial magnetic bearings 6-1 to 6-3 are positioned more away from the processing chamber 3 than the cooling zones 15, the gas purge zone 16 and the upper electromagnets 6-1a and 6-1b to 6-3a and 6-3b of the axial magnetic bearings 6-1 to 6-3, which bear the weight of the rotor 4, thereby maintaining the stability of the sensor function.

The displacement sensors 5-1b and 5-1c to 5-4b and 5-4c and the displacement sensors 6-1d to 6-3d are inductance type sensors. A thin non-magnetic partition (can) (not shown) is put between these sensors and the rotor-side sensor target. The thin partition has a cap-shaped structure, which is sealed with respect to the main partition 14 with an O-ring 17.

The inductance type sensor detects a change in the gap between the sensor and a levitating target (in this case, the rotor 4) on the basis of a change in the inductance of a detection coil. In this sensor, a natural frequency signal (carrier signal) of constant-amplitude voltage is applied to the detection coil. When there is a change in the gap present in the magnetic circuit of the detection coil, the coil inductance changes, and hence the electric current flowing through the coil changes. Based on this phenomenon, the carrier signal modulated by the change in the inductance of the detection coil is effectively detected by using a bridge circuit. If an electrically conductive material is used for the partition 14, a secondary circuit occurs and undesirably affects the detection coil as a mutual conductance. Therefore, the frequency of the sensor carrier signal is lowered to reduce the influence of the secondary circuit, although this trades off the response frequency performance of the sensor.

The gap between the rotor side and the stator side can be set to be relatively large at a portion provided with the radial magnetic bearings 5-1 to 54 (for 2 axes), which is positioned approximately at the height of the gravity center of the rotor 4, and the motor for 8, which is positioned below it. Therefore, portion 4a of the rotor 4 in this part is made of a non-magnetic material. A type of induction motor is used as the motor 8. The main reason for using a non-magnetic material for the rotor-side target (the portion 4a of the rotor 4) of the motor 8 is to minimize radial external force at the position of the motor 8 and to reduce the load on the radial magnetic bearings 5-1 to 5-4, thereby correspondingly reducing the size of the radial magnetic bearings 5-1 to 54.

The portion 4a of the rotor 4, which serves as the rotor of the motor 8, is made of a surface-treated aluminum material. The portion 4b of the rotor 4 above the portion 4a, at which the displacement sensors 5-1b and 5-1c to 5-4b and 5-4c and the electromagnets 5-1a to 5-4a of the radial magnetic bearings 5-1 to 5-4 are located, is made of a magnetic material (e.g. electromagnetic stainless steel or permalloy). A portion 4c of the rotor 4 above the portion 4b is made of an austenic stainless steel, e.g. SUS316, molybdenum, or a surface-treated carbon material because this portion 4c is closer to the processing chamber 3 including a corrosive gas of high temperature.

Because the processing temperature of the substrate 1 in the processing chamber 3 reaches 1000° C., it is necessary to provide a sufficient temperature gradient in the course of heat transfer from the processing chamber 3 through the rotor 4 to the axial magnetic bearings 6-1 to 6-3 and the radial magnetic bearings 5-1 to 5-4. Therefore, the portion 4c of the rotor 4, at which the cooling zones 15 and the gas purge zone 16 are located, has a reduced wall thickness.

In the substrate rotating apparatus according to this embodiment, the axial magnetic bearing 6 is divided into three, which is equal to the smallest number of axes necessary for stable horizontal support of the rotor, as stated above. Therefore, the operation of the axial magnetic bearing can be controlled by using a conventional control circuit adapted to control each axis independently. Accordingly, it is possible to reduce the size and costs of the controller.

Figure 7:
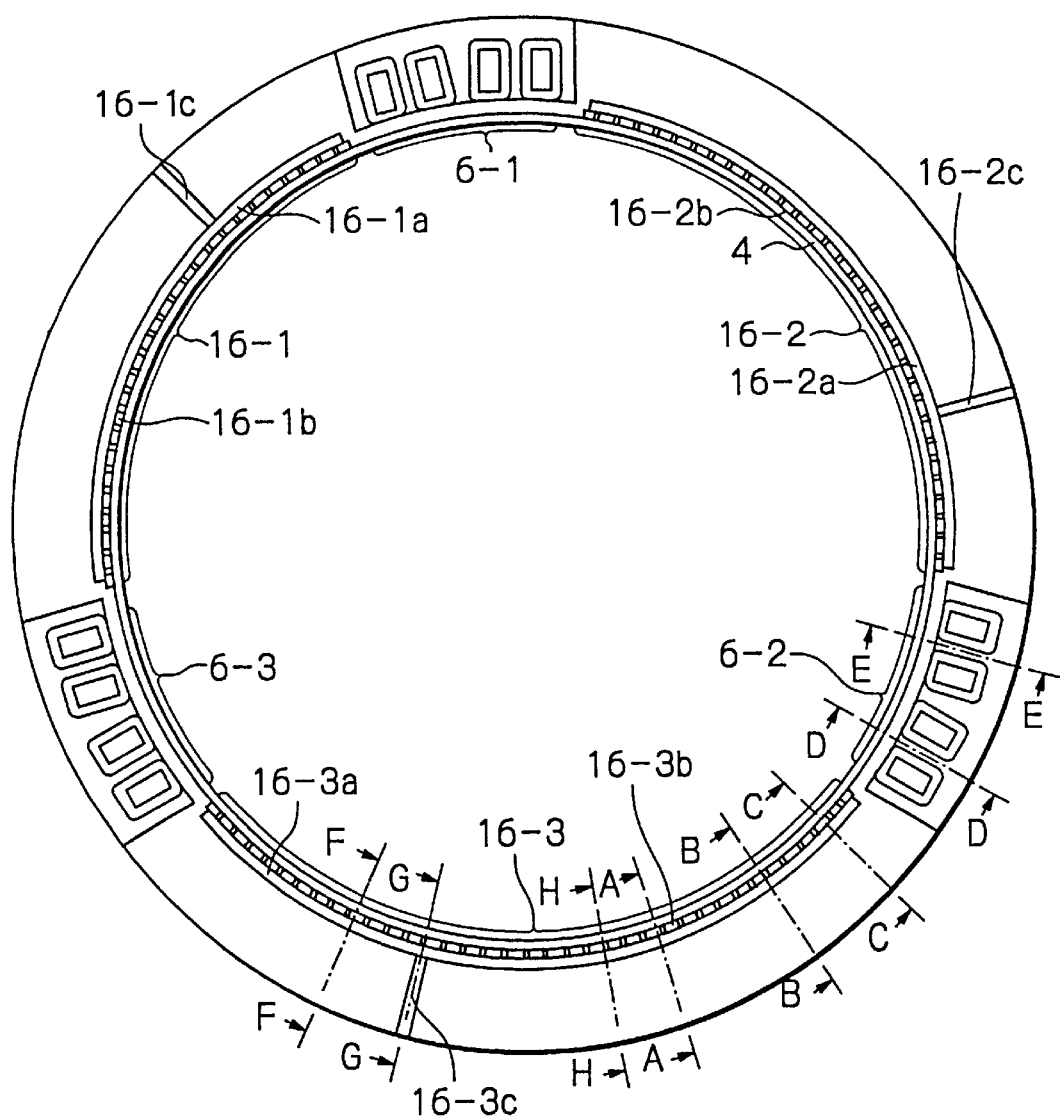
FIG. 7 is a diagram showing a planar arrangement of gas purge zones of the substrate rotating apparatus according to the embodiment of the present invention.

FIG. 7 is a diagram showing the planar arrangement of the gas purge zone 16. As illustrated in the Figure, the gas purge zone 16 is divided into zones 16-1, 16-2-and 16-3. The zones 16-1, 16-2 and 16-3 have purge gas supply chambers 16-1a, 16-2a and 16-3a, respectively, each having openings that open on the inner side thereof. The openings of the zones 16-1, 16-2 and 16-3 are provided by nozzle plates 16-1b, 16-2b and 16-3b, respectively, each having a large number of nozzle holes. When a purge gas is supplied into the purge gas chambers 16-1a, 16-2a and 16-3a from gas inlets 16-1c, 16-2c and 16-3c, the purge gas is supplied to the gap between the rotor 4 and the partition 14 through the nozzle plates 16-1b, 16-2b and 16-3b.

It should be noted that the substrate rotating apparatus according to this embodiment is provided with touch-down bearings that operate when the radial magnetic bearings 5-1 to 5-4 and the axial magnetic bearings 6-1 to 6-3 do not operate properly. As shown in FIGS. 5(f) and 5(j), the touch-down bearings include a radial touch-down bearing 18 for supporting the rotor 4 in the radial direction and an axial touch-down bearing 19 for supporting the rotor 4 in the axial direction.

The radial touch-down bearing 18 has a plurality of bearings 18-1 with a small diameter that are rotatably supported by respective support members 18-2. The bearings 18-1 are disposed at predetermined intervals around the outer periphery of the rotor 4 below the horizontal disk 13 with a predetermined gap between each bearing 18-1 and the outer peripheral surface of the rotor 4. The axial touch-down bearing 19 has a plurality of bearings 19-1 with a small diameter that are rotatably supported by respective support members 19-2. The bearings 19-1 are disposed at predetermined intervals at each of the upper and lower surfaces of the horizontal disk 13 with a predetermined gap between each bearing 19-1 and the upper and lower surface of the horizontal disk 13.

Figure 8A:
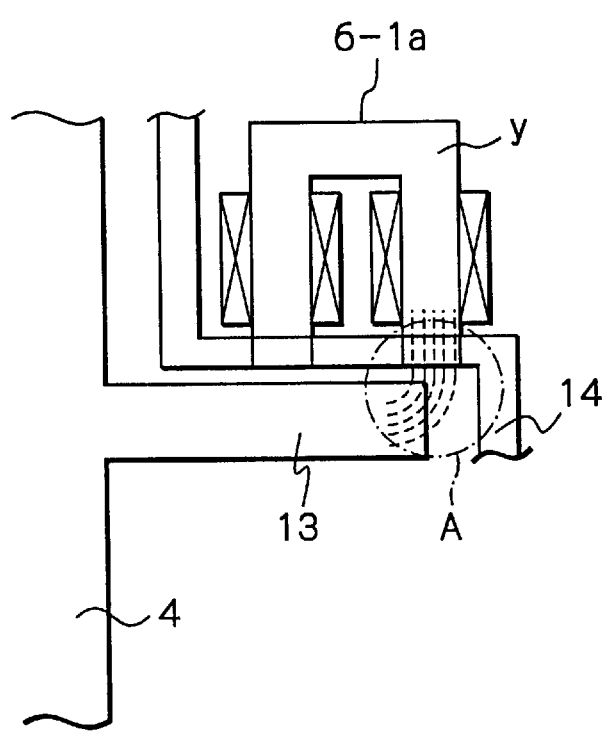
FIGS. 8(a) and 8(b) are diagrams illustrating a generation of radial restoring force by an axial magnetic bearing.
Figure 8B:
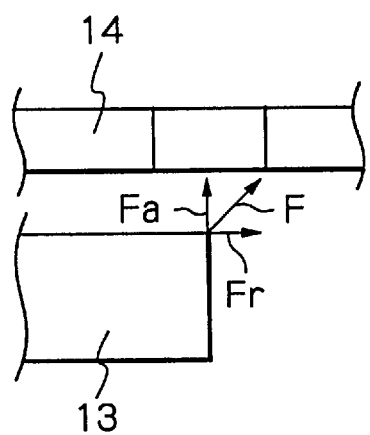

In the substrate rotating apparatus according to this embodiment, the upper electromagnets 6-1a and 6-1b to 6-3a and 6-3b of the axial magnetic bearings 6-1 to 6-3, which are located above the horizontal disk 13, are adapted to generate restoring force in the radial direction. FIGS. 8(a) and 8(b) illustrate the generation of restoring force. FIG. 8(a) is a diagram showing the positional relationship between the upper electromagnet 6-1a and the horizontal disk 13, and FIG. 8(b) is an enlarged view of portion A in FIG. 8(b). As illustrated in these Figures, when the outer peripheral portion of the horizontal disk 13 is displaced inward of the yoke (magnetic pole) y of the upper electromagnet 6-1a, radial restoring force Fr and axial restoring force Fa are generated from magnetic attraction force F produced by magnetic flux passing through the outer peripheral portion of the horizontal disk 13 and the end portion of the yoke y. The rotor 4 is restored in the radial direction by the radial restoring force Fr. The provision of two upper electromagnets in each axial magnetic bearing can provide an increased radial restoring force to the rotor 4.

The arrangement of the radial magnetic bearing may be as follows. As shown in FIG. 9(a), electromagnets 21 having exciting windings on U-shaped yokes (magnetic poles) are disposed (in the X- and Y-axis directions) on the stator side to face the rotor 4 made of a magnetic material, and magnetic attraction force is used as radial control force. Alternatively, the radial magnetic bearing may be arranged such that electromagnets 5-1a to 5-4a having the same electromagnet structure as the above, i.e. having exciting windings on U-shaped yokes, are similarly disposed on the stator side as shown in FIG. 9(a), but the rotor 4 is formed by using a non-magnetic material of low resistivity (e.g. aluminum or copper), and an inductive repelling force is used as a radial control force.

When a cylindrical rotor 4 with a large diameter is subjected to control forces in the X- and Y-axis directions, it is deformed by the control forces if the rigidity thereof is not sufficient. Deformation of the rotor 4 can be prevented by disposing the electromagnets 5-1a to 5-4a as shown in FIG. 9(b). That is, the electromagnets 5-1a and 53a are disposed to face each other across the rotor 4 in the Y-axis direction, and the electromagnets 5-2a and 5-4a are disposed to face each other across the rotor 4 in the X-axis direction.

It should be noted that reference numeral 20 in FIGS. 5(f) and 5(j) and 6 denotes a rotational position sensor for detecting the rotational position of the rotor 4. An eddy-current type sensor is used as the rotational position sensor 20. The eddy-current type sensor requires that the partition 14 be a non-electrical conductor. Therefore, as shown in FIG. 10, a protective casing 20-1 made of $SiO_2$ ceramic is disposed through the partition 14 so as to face the rotor 4, and an eddy-current type sensor element 20-2 is accommodated in the protective casing 20-1. It should be noted that reference numeral 20-3 denotes an O-ring for sealing between the protective casing 20-1 and the partition 14.

As stated above, the electromagnets and the displacement sensors of the magnetic bearings are protected from exposure to a special atmosphere, e.g. a corrosive gas, by placing a partition (can) between the electromagnets and the displacement sensors and the rotor. In this case, however, the gap between the rotor and the electromagnets and displacement sensors increases by an amount corresponding to the thickness of the partition. This causes the magnetic reluctance to increase. Consequently, the control magnetic force of the electromagnets decreases, and the sensitivity of the displacement sensors degrades. In particular, when the diameter of the partition increases, the strength thereof also needs to be increased, as stated above. That is, the partition needs to be formed into a thick-walled pressure resistive partition, Accordingly, it is necessary to increase the magnetomotive force of the coils of the electromagnets and those of thedisplacement sensors, and hence the coils become large in size.

Figure 11A:
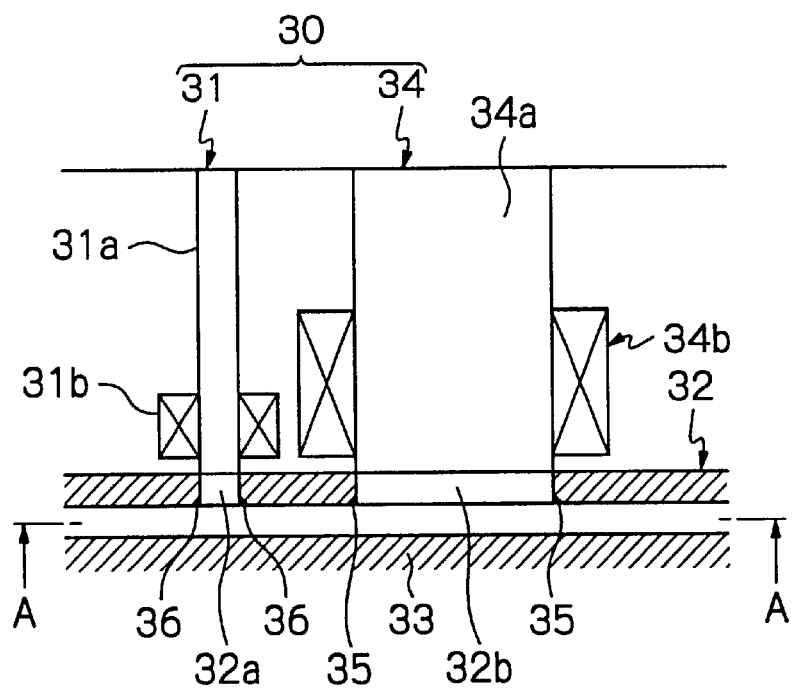
Figure 11B:
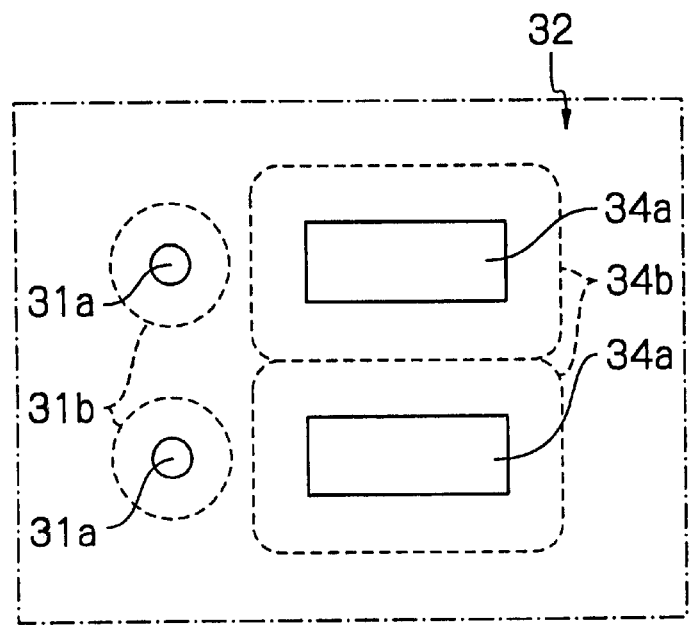

Therefore, in the present invention, the portions 14a of the partition 14, where the yokes of the electromagnets 5-1a to 5-4a of the radial magnetic bearings 5-1 to 5-4 and the electromagnets 64a, 6-1b and 6-1c to 6-3a, 6-3b and 63c of the axial magnetic bearings 6-1 to 6-3 are located, are made of a magnetic material of the same electromagnetic property as that of the yokes. The magnetic material is fitted in or inserted in the portions 14a of the partition 14 to solve the above-described problem, as stated above. The solution measures will be described below more specifically with reference to FIGS. 11(a) and 11(b). FIGS. 11(a) and 11(b) show the arrangement of a magnetic bearing, in which FIG. 11(a) is a sectional view of the magnetic bearing, and FIG. 11(b) is a view as seen in the direction of the arrow A—A in FIG. 11(a).

As illustrated in the Figures, a partition 32 is made of a non-magnetic metal material. Magnetic members 32a are fitted in or inserted in portions of the partition 32 where the ends of a sensor yoke 31a of a displacement sensor 31 of a magnetic bearing 30 are located so that the magnetic members 32a face a levitating member or rotor 33. The magnetic members 32a are made of the same material or material having a same electromagnetic property as that of the sensor yoke 31a. Similarly, magnetic members 32b are fitted in portions of the partition 2 where the ends of a magnet yoke 34a of an electromagnet 34 are located so that magnetic members 32b face the levitating member 33. The magnetic members 32b are made of the same material or material having a same electromagnetic property as that of the magnet yoke 34a. The portions of the partition 32 in which the magnetic members 32a and 32b are fitted are provided with joint sealing portions 35 and 36, respectively, by welding or the like. It should be noted that a sensor coil 31b is fitted on the sensor yoke 31a, and a magnet coil 34b is fitted on the magnet yoke 34a.

Because the magnetic members 32a and 32b are fitted in the portions of the partition 32 where the sensor yoke 31a and the magnet yoke 34a are located, respectively, even if the wall thickness of the partition 32 is increased, there will be no increase in the magnetic reluctance between the sensor yoke 31a and the levitating member 33 and in the magnetic reluctance between the magnet yoke 34a and the levitating member 33. Thus, the sensor sensitivity is improved, and hence it is possible to detect a displacement of the levitating member 33 with high accuracy. Therefore, it is unnecessary to increase the size of the sensor coil 31b. In addition, because the magnetic reluctance between the magnet yoke 34a and the levitating member 33 does not increase, there is no reduction in control magnetic force acting on the levitating member 33. Accordingly, it is unnecessary to increase the size of the magnet coil 34b.

Although in the above-described example the magnetic members 32a and 32b are fitted in or inserted in the portions of the partition 32 where the ends of the sensor yoke 31a and the magnet yoke 34a are located, respectively, the arrangement may be such that the ends of the sensor yoke 31a and the magnet yoke 34a themselves pierce through the partition 32 to face the levitating member 33 directly.

In this kind of substrate rotating apparatus, when whirling or runout of the rotor appears and a displacement sensor output signal caused thereby exceeds a certain set value, the following measures are usually taken to cope with the situation: 1) the control of the magnetic bearings is cut off (suspended); or 2) while the control of the magnetic bearings is continued, the rotation of the rotor is suspended. Measure 1) may further include suspending the rotation of the rotor. In the case of measure 1), only after a displacement sensor output has exceeded a certain set value, an abnormality is recognized, and the rotor suddenly touches down undesirably is the measure taken. In the case of measure 2) also, only after a displacement sensor output has exceeded a certain set value, an abnormality is recognized, and the rotation of the rotor is suspended suddenly is the measure taken.

In the case of using the above-described substrate rotating apparatus in a substrate processing system, in particular, when rotation is suddenly suspended during processing, the substrate that has been under processing becomes "unserviceable". Because substrates in the semiconductor manufacturing process, i.e. semiconductor wafers, are expensive, it is desired that the occurrence of defective substrates be avoided as much as possible. In addition, the procedure by which the control of the magnetic bearings is suddenly cut off to bring about the rotor touch down gives rise to the problem that the substrate mounted on the rotor may be damaged.

Figure 12:
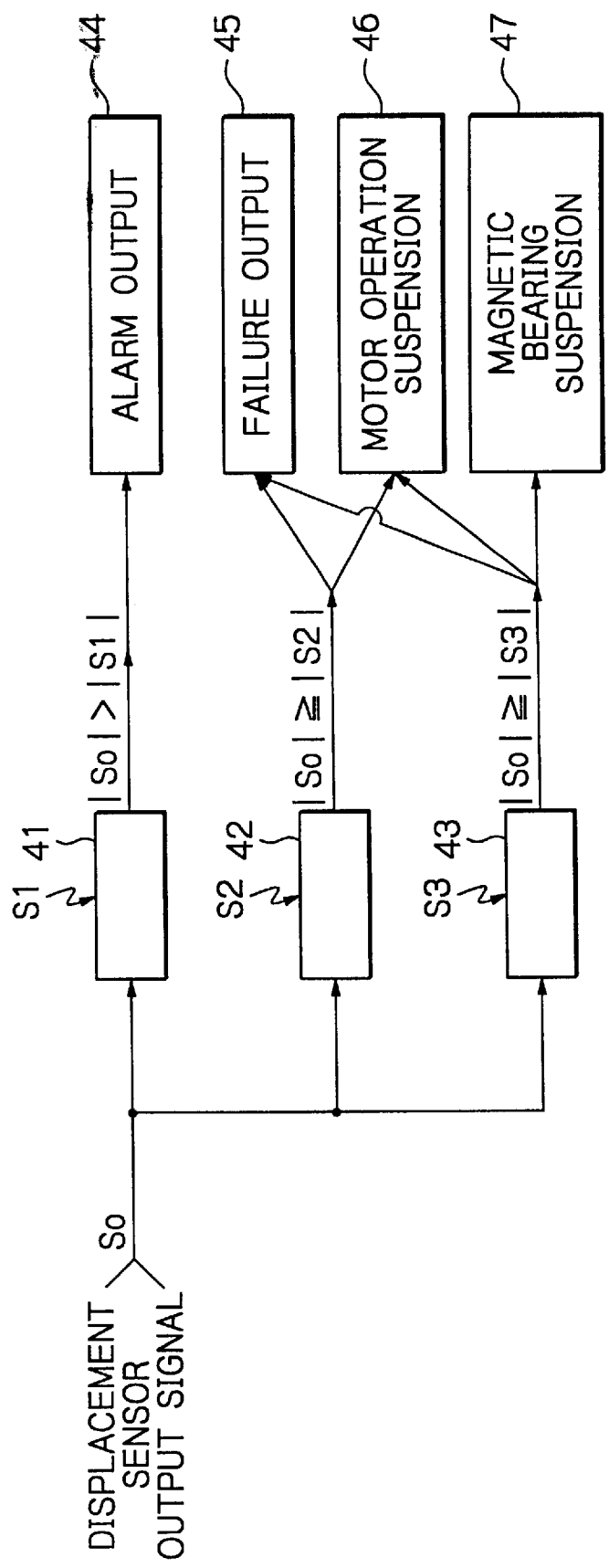
FIG. 12 is a diagram showing a structural example of an abnormality detecting circuit of the substrate rotating apparatus according to the present invention.
Figure 13:
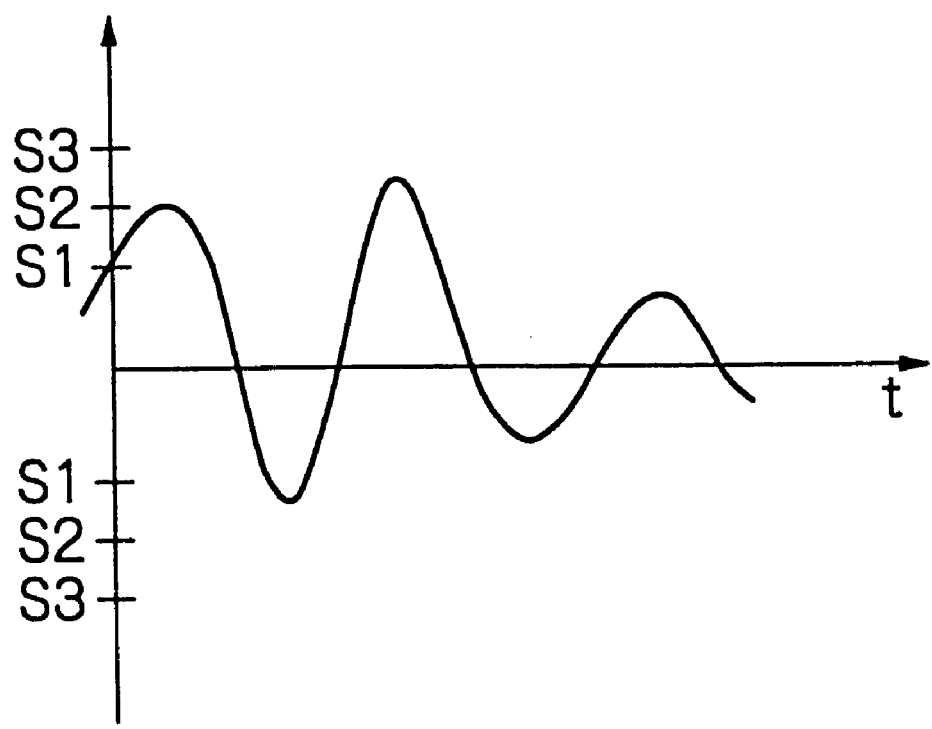
FIG. 13 is a diagram showing an example of output from a displacement sensor of the substrate rotating apparatus according to the present invention.

Accordingly, an abnormality detecting circuit is constructed by using three comparator circuits 41, 42 and 43 as shown for example in FIG. 12. That is, threshold values (reference values) S1, S2 and S3 are set in the comparator circuits 41, 42 and 43, respectively. The threshold values S1, S2 and S3 are related to each other as shown in FIG. 13, i.e. $|S1|<|S2|<|S3|$. A displacement sensor output signal So is input to each of the comparator circuits 41, 42 and 43.

In the abnormality detecting circuit arranged as stated above, when the sensor output signal So satisfies the condition of $|So|>|S1|$, the comparator circuit 41 drives an alarm circuit 44 to output an alarm only. When $|So| \geq |S2|$, the comparator circuit 42 drives both a failure output circuit 45 and a motor operation suspension circuit 46 to notify of the occurrence of a failure and to suspend the motor operation. When $|So| \geq |S3|$, the comparator circuit 43 drives the failure output circuit 45, the motor operation suspension circuit 46 and a magnetic bearing suspension circuit 47 to notify of the occurrence of a failure and to suspend the motor operation and the levitation control of the magnetic bearings.

Thus, an abnormality is detected stepwisely, and an abnormal situation is inputted stepwisely to the main control unit of the semiconductor manufacturing system, which controls the substrate rotating apparatus, thereby making it possible to reduce the incidence of suspension of the rotor during processing of a substrate. It should be noted that the abnormality detecting circuit shown in FIG. 12 is merely an example, and the present invention is not necessarily limited thereto. For example, the arrangement may be such that the threshold values S1, S2 and S3 of the displacement sensors are stored in a storage unit in advance, and the processing of each of the comparator circuits 41, 42 and 43 is executed by a computer to deliver an alarm output or a failure output and to suspend the motor operation and the magnetic bearing control. The number of threshold values is not necessarily limited to 3 but may be 2 or more.

As has been stated above, the present invention provides the following advantageous effects.

According to the present invention, the axial magnetic bearing is divided into three or more magnetic bearings and these magnetic bearings are positioned so that imaginary lines connecting points where the divided axial magnetic bearings are disposed form an approximately regular triangle or polygon. As a result, the operation of the axial magnetic bearing can be controlled by using a conventional control circuit adapted to control each axis independently. Accordingly, it is possible to simplify the controller and to achieve a reduction in size of the controller. Moreover, even if the diameter of the rotor increases, the diameter of the electromagnet of each of the axial magnetic bearings will not increase. In addition, because position control in the axial direction is effected at the position of each axial magnetic bearing, motion about the radial axes is also stabilized. Accordingly, any unstable force such as unstable torque (unbalanced torque) produced by the electromagnets of the conventional axial magnetic bearing is minimized.

The rotor may be placed in a space communicating with the processing chamber, and the stator-side constituent members of the magnetic bearings and the stator-side constituent member of the motor may be placed in a space defined outside the space communicating with the processing chamber by a partition provided between the rotor and the stator-side constituent members. Further, a material electromagnetically equivalent to the yokes of electromagnets as stator-side constituent members of the magnetic bearings may be fitted in portions of the partition where the yokes are located, and the partition may constitute a stator housing as a whole. Instead, the ends of yokes of electromagnets as stator-side constituent members of the magnetic bearings may pierce through the partition so as to face the rotor directly. Therefore, even if the wall thickness of the partition is increased to form a pressure resistive partition, there is no reduction in magnetic control force. Accordingly, it is possible to provide a substrate rotating apparatus capable of meeting the demands for an increased lifetime, non-particle environment and improvement in the occupied space efficiency in the field of semiconductor manufacture, in which substrates to be processed are becoming larger in diameter. Furthermore, because the stator-side constituent members of the magnetic bearings may be disposed outside the partition, it is possible to replace or repair the component parts of the magnetic bearings and the motor components while keeping the processing chamber and the space communicating with the processing chamber under a special atmosphere.

Translational motion in two radial axes (X- and Y-directions) may be passively supported by a radial restoring force generated when the relative position between the yoke of an electromagnet as a stator-side constituent member of the axial magnetic bearing and the horizontal disk as a rotor-side constituent member of the axial magnetic bearing is displaced in a translational direction (horizontal direction). Accordingly, the rotor can be stably supported in a magnetic levitation manner.

In addition, the stator housing may include a cooling zone in the vicinity of the processing chamber and further may include a gas purge zone located across the cooling zone from the processing chamber. Therefore, it is possible to suppress a rise in temperature of displacement sensors of the magnetic bearings and hence possible to detect the displacement of the rotor position with high accuracy.

It should be noted that the present invention is not necessarily limited to the foregoing embodiments but can be modified in a variety of ways.

For example, the axial magnetic bearing may be divided into more than three magnetic bearings and may be positioned so that imaginary lines connecting points where the divided axial magnetic bearings are disposed form an approximately regular polygon. However, to attain a simple construction, easy maintenance, excellent reliability and productivity of the apparatus, the axial magnetic bearing is preferably divided into three magnetic bearings.

Also, in the embodiment shown, although the radial magnetic bearing is provided at one axial position of the substitute rotating apparatus, it is preferable to provide it at two or more axial positions to further stabilize the rotor.

What is claimed is:

1. A substrate rotating apparatus comprising:
    a rotor provided in a space communicating with a processing chamber, said rotor having a horizontal disk provided thereon, and said rotor being operable to rotate a substrate located thereon;
    magnetic bearings comprising electromagnets having yokes, said magnetic bearings being operable to support said rotor, said magnetic bearings including an axial magnetic bearing and a radial magnetic bearing, and said electromagnets being stator-side constituent members of said magnetic bearings; and
    a motor having a stator-side constituent member, said motor being operable to apply a rotational force to said rotor to rotate the substrate in the processing chamber,
    wherein said axial magnetic bearing comprises at least three divided axial magnetic bearings positioned so that imaginary lines connecting points where each of said at least three divided axial magnetic bearings are disposed form an approximately regular triangle or polygon, said electromagnets of said at least three divided axial magnetic bearings being disposed substantially above and below said horizontal disk of said rotor,
    wherein said stator-side constituent members of said magnetic bearings and said stator-side constituent member of said motor are located in a space defined to be outside of the space communicating with the processing chamber by a partition acting as a stator housing, said partition located between said rotor and said stator-side constituent members of said magnetic bearings and said stator-side constituent member of said motor, and
    wherein portions of said partition where said yokes of said electromagnets are located are fitted with a material that is electromagnetically equivalent to said yokes of said electromagnets as said stator-side constituent members of said magnetic bearings.

2. A substrate rotating apparatus according to claim 1, wherein said stator housing has a cooling zone in the vicinity of the processing chamber.

3. A substrate rotating apparatus according to claim 2, wherein said stator housing has a gas purge zone located across said cooling zone from the processing chamber.

4. A substrate rotating apparatus according to claim 1, wherein said axial magnetic bearing has three divided axial magnetic bearings positioned so that imaginary lines connecting points where each of said three divided axial magnetic bearings are disposed form an approximately regular triangle.

5. A substrate rotating apparatus comprising:
    a rotor provided in a space communicating with a processing chamber, said rotor having a horizontal disk provided thereon, and said rotor being operable to rotate a substrate located thereon;
    magnetic bearings comprising electromagnets having yokes, said magnetic bearings being operable to support said rotor, said magnetic bearings including an axial magnetic bearing and a radial magnetic bearing, and said electromagnets being stator-side constituent members of said magnetic bearings; and
    a motor having a stator-side constituent member, said motor being operable to apply a rotational force to said rotor to rotate the substrate in the processing chamber,
    wherein said axial magnetic bearing comprises at least three divided axial magnetic bearings positioned so that imaginary lines connecting points where each of said at least three divided axial magnetic bearings are disposed form an approximately regular triangle or polygon, said electromagnets of said at least three divided axial magnetic bearings being disposed substantially above and below said horizontal disk of said rotor,
    wherein said stator-side constituent members of said magnetic bearings and said stator-side constituent member of said motor are located in a space defined to be outside of the space communicating with the processing chamber by a partition located between said rotor and said stator-side constituent members of said magnetic bearings and said stator-side constituent member of said motor, and
    wherein ends of said yokes of said electromagnets as said stator-side constituent members of said magnetic bearings pierce through said partition so as to face said rotor directly.

6. A substrate rotating apparatus according to claim 5, wherein said axial magnetic bearing has three divided axial magnetic bearings positioned so that imaginary lines connecting points where each of said three divided axial magnetic bearings are disposed form an approximately regular triangle.

7. A substrate rotating apparatus comprising:
    a rotor having a horizontal disk provided thereon, said rotor being operable to rotate a substrate located thereon;
    magnetic bearings comprising electromagnets having yokes, said magnetic bearings being operable to support said rotor, said magnetic bearings including an axial magnetic bearing and a radial magnetic bearing, and said electromagnets being stator-side constituent members of said magnetic bearings; and a motor having a stator-side constituent member, said motor being operable to apply a rotational force to said rotor to rotate the substrate in a processing chamber, wherein said axial magnetic bearing comprises said horizontal disk as a rotor-side constituent member and at least three divided axial magnetic bearings positioned so that imaginary lines connecting points where each of said at least three divided axial magnetic bearings are disposed form an approximately regular triangle or polygon, said electromagnets of said at least three divided axial magnetic bearings being disposed substantially above and below said horizontal disk of said rotor, and wherein translational motion in two radial axes is passively supported by a radial restoring force generated when relative positioning between said yoke of one of said electromagnets as one of said stator-side constituent members of said axial magnetic bearing and said horizontal disk as said rotor-side constituent member of said magnetic bearing is displaced in a translational direction.

8. A substrate rotating apparatus according to claim 7, wherein said axial magnetic bearing has three divided axial magnetic bearings positioned so that imaginary lines connecting points where each of said three divided axial magnetic bearings are disposed form an approximately regular triangle.

9. A substrate rotating apparatus comprising:

a rotor having a horizontal disk provided thereon, said rotor being operable to rotate a substrate located thereon;

magnetic bearings operable to support said rotor, said magnetic bearings each having at least one displacement sensor operable to detect a displacement of said rotor and output an output signal So, and said magnetic bearings including an axial magnetic bearing and a radial magnetic bearing, said axial magnetic bearing comprising at least three divided axial magnetic bearings positioned so that imaginary lines connecting points where each of said at least three divided axial magnetic bearings are disposed form an approximately regular triangle or polygon;

a motor operable to apply rotational force to said rotor to rotate the substrate in a processing chamber; and comparator circuits operable to compare the output signals So from said displacement sensors with stepwise threshold values $|S1|<|S2|<|S3|$ set in said comparator circuits, wherein a first of said comparator circuits drives an alarm when $|So|>|S1|$, a second of said comparator circuits drives a failure output circuit which notifies of an occurrence of a failure of said substrate rotating apparatus and a motor operation suspension circuit which suspends operation of said motor when $|So| \geq |S2|$, and a third of said comparator circuits drives said failure output circuit, said motor operation suspension circuit, and a magnetic bearing suspension circuit which suspends a levitation control of said magnetic bearings when $|So| \geq |S3|$, wherein electromagnets comprising said at least three divided axial magnetic bearings are disposed substantially above and below said horizontal disk of said rotor.

10. A substrate rotating apparatus according to claim 9, further comprising:

a storage unit operable to store the stepwise threshold values $|S1|$, $|S2|$, and $|S3|$; and a computer operable to execute the processing of each of said comparator circuits and to drive the alarm circuit, the failure output circuit, the motor operation suspension circuit, and the magnetic bearing suspension circuit.

11. A substrate rotating apparatus according to claim 9, wherein said axial magnetic bearing has three divided axial magnetic bearings positioned so that imaginary lines connecting points where each of said three divided axial magnetic bearings are disposed form an approximately regular triangle.

\* \* \* \* \*